United States Patent
Cheng et al.

(10) Patent No.: US 11,411,338 B2
(45) Date of Patent: Aug. 9, 2022

(54) MIXER PITCH ARRANGEMENT FOR CPU SOCKET

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventors: Shan-Yong Cheng, New Taipei (TW); Chao-Chieh Chen, New Taipei (TW); Ming-Lun Szu, New Taipei (TW)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

(*) Notice: Subject to any disclaimer, the term of this patent is extended or adjusted under 35 U.S.C. 154(b) by 50 days.

(21) Appl. No.: 16/992,119

(22) Filed: Aug. 13, 2020

(65) Prior Publication Data

US 2021/0050686 A1    Feb. 18, 2021

Related U.S. Application Data

(60) Provisional application No. 62/886,953, filed on Aug. 14, 2019, provisional application No. 62/886,332, filed on Aug. 13, 2019.

(51) Int. Cl.
*H01R 12/00* (2006.01)
*H01R 13/24* (2006.01)
(Continued)

(52) U.S. Cl.
CPC ......... *H01R 13/2442* (2013.01); *H01R 12/52* (2013.01); *H01R 12/7082* (2013.01);
(Continued)

(58) Field of Classification Search
CPC .... H01R 13/24; H01R 13/2442; H01R 12/52; H01R 12/7082; H01R 12/714; H01R 2201/06; H05K 7/1069
(Continued)

(56) References Cited

U.S. PATENT DOCUMENTS 7,160,115 B2    1/2007  Huang et al.
7,625,217 B1   12/2009  Liao
(Continued)

FOREIGN PATENT DOCUMENTS

CN    2417604 Y    1/2001
CN    2554833 Y    6/2003
(Continued)

*Primary Examiner* — Khiem M Nguyen
(74) *Attorney, Agent, or Firm* — Ming Chieh Chang; Wei Te Chung (57) ABSTRACT

A CPU socket has an insulative housing equipped with two groups of contacts of different pitches from each other wherein either each group of contacts are arranged with the corresponding contacting arms extending in opposite directions to counterbalance the imposed/reaction forces itself or the two group of contacts are arranged with the corresponding contacting arms extending in opposite direction to somewhat counterbalance the imposed/reaction force during receiving a CPU therein, and or in a mixed manner, i.e., one group of contact with the corresponding contacting arms in the same direction while the other of contacts with the corresponding contacting arms extending in both opposite directions to achieve the total reaction forces in a substantial balanced manner.

15 Claims, 11 Drawing Sheets

(51) Int. Cl.
*H05K 7/10* (2006.01)
*H01R 12/52* (2011.01)
*H01R 12/71* (2011.01)
*H01R 12/70* (2011.01)

(52) U.S. Cl.
CPC ......... *H01R 12/714* (2013.01); *H05K 7/1069* (2013.01); *H01R 2201/06* (2013.01)

(58) Field of Classification Search
USPC ...................................................... 439/66, 83
See application file for complete search history.

(56) References Cited

U.S. PATENT DOCUMENTS

| | | |
|---|---|---|
| 8,454,373 B2 | 6/2013 | Cheng et al. |
| 2006/0024987 A1 | 2/2006 | Huang et al. |
| 2008/0242121 A1* | 10/2008 | Browning ............ H05K 7/1053 439/65 |
| 2010/0291774 A1* | 11/2010 | Cheng ................ H01R 13/2435 439/66 |
| 2021/0050686 A1* | 2/2021 | Cheng ................ H01R 12/7082 |

FOREIGN PATENT DOCUMENTS

| | | |
|---|---|---|
| CN | 2562403 Y | 7/2003 |
| CN | 2727996 Y | 9/2005 |
| CN | 2779652 Y | 5/2006 |
| CN | 1825710 A | 8/2006 |
| CN | 201113143 Y | 9/2008 |
| CN | 201230103 Y | 4/2009 |
| CN | 201397920 Y | 2/2010 |
| CN | 101944697 A | 1/2011 |
| CN | 208045745 U | 11/2018 |
| TW | M310509 U | 4/2007 |
| TW | M377741 U | 4/2010 |
| TW | M507086 U | 8/2015 |

* cited by examiner

MIXER PITCH ARRANGEMENT FOR CPU SOCKET

The instant application is related to the previous provisional application Serial Nos. 62/886,332 filed on Aug. 13, 2019 and 62/886,953 filed on Aug. 14, 2019.

BACKGROUND OF THE INVENTION

1. Field of the Invention

The present invention relates generally to an electrical connector for use with the CPU (Central Processing Unit), and particularly to the CPU socket equipped with the contacts of mixed pitches.

2. Description of Related Arts

Figure 1:
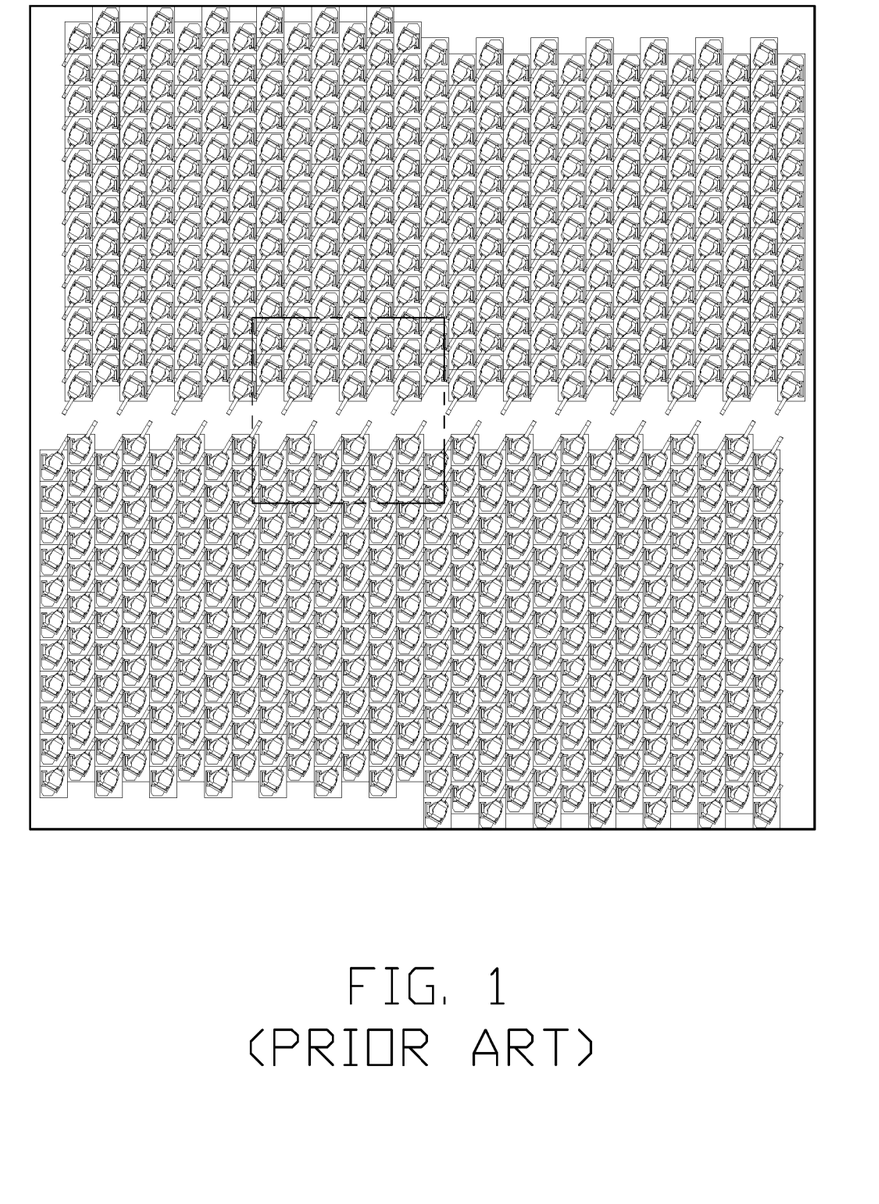
FIG. 1 is a top view of the traditional regular 0.8 pitch CPU socket.
Figure 1A:
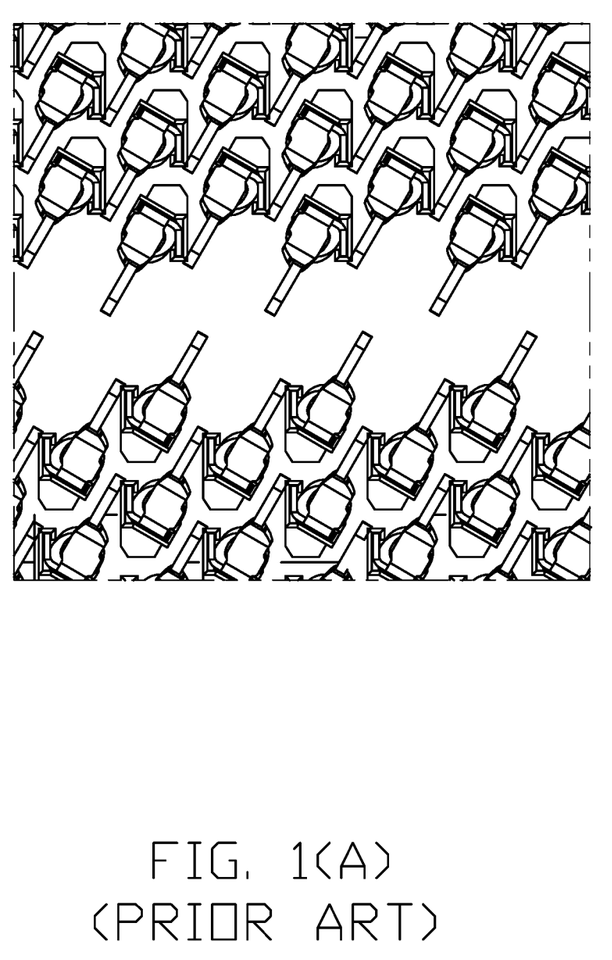
FIG. 1(A) is an enlarged top view of a portion of the traditional regular 0.8 pitch CPU socket of FIG. 1.
Figure 2:
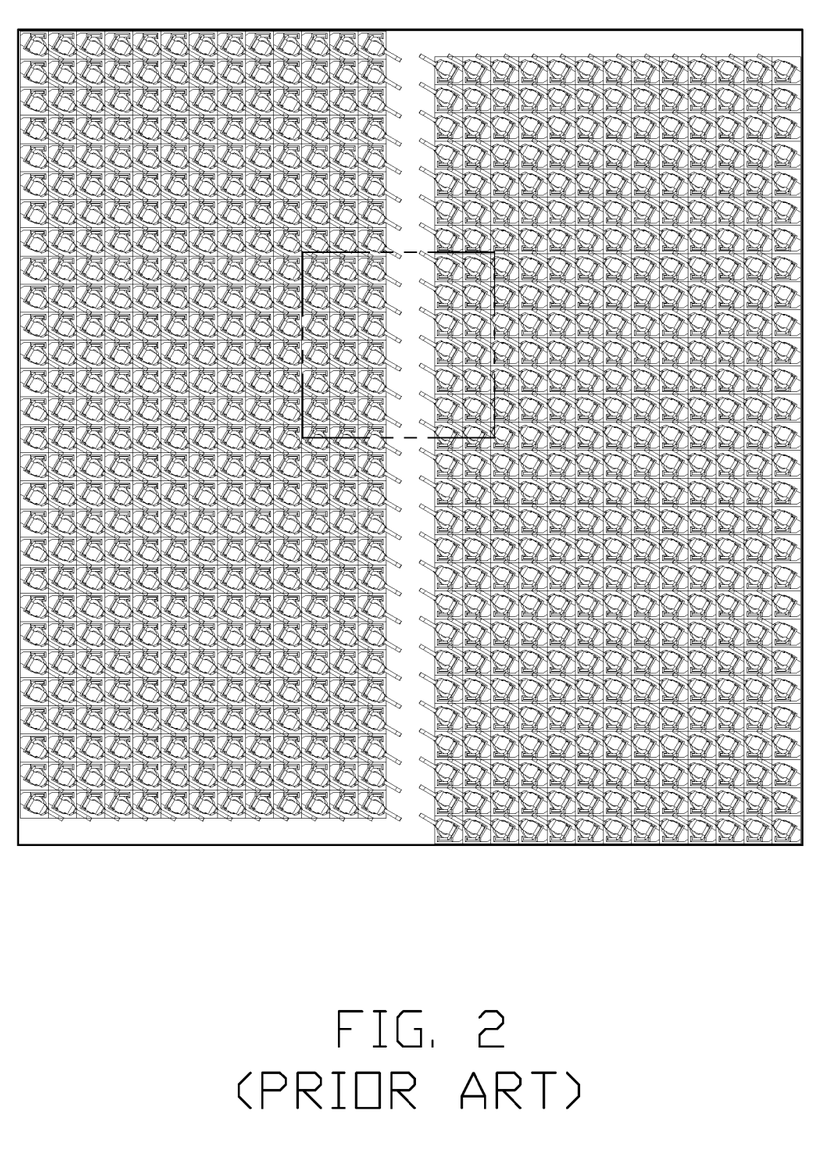
FIG. 2 is a top view of the traditional hex 0.9 pitch CPU socket.
Figure 2A:
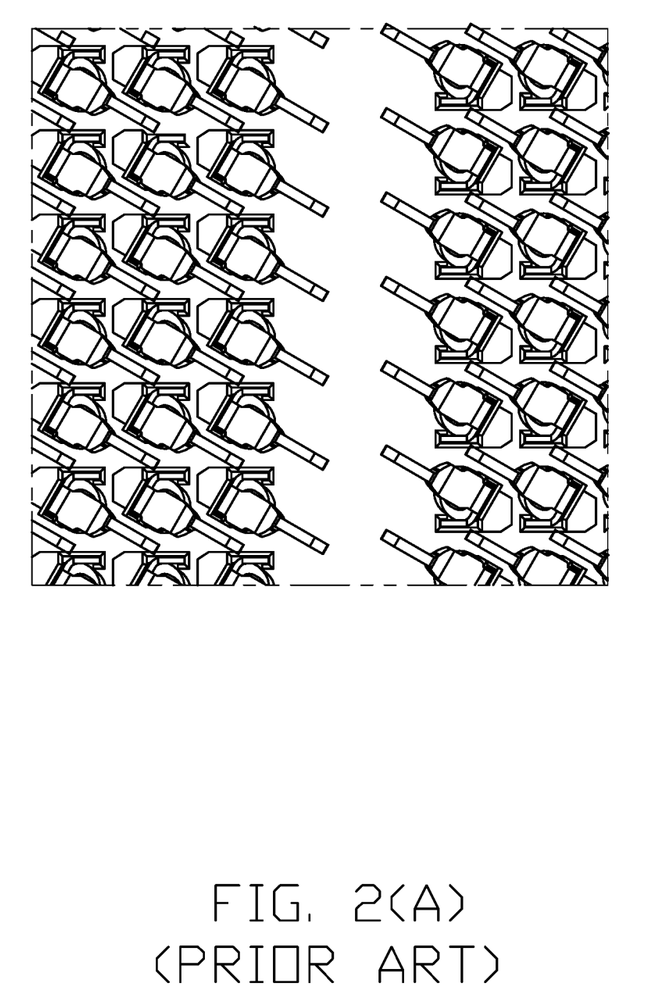
FIG. 2(A) is an enlarged top view of a portion of the traditional hex 0.9 pitch CPU socket of FIG. 2.

The traditional CPU socket has the contacts arranged in matrix with the same pitch, either of the regular 0.8 pitch or the hex 0.9 pitch, wherein the former as shown in FIGS. 2 and 2(A) is related to the contacts aligned with the neighboring contacts in both the row direction and the column direction which are perpendicular to each other while the latter as shown in FIGS. 1 and 1(A) is related to the contacts offset from the neighboring contacts with a half pitch in both the row direction and the column direction. Such arrangements may require to consider the wiping action applied upon the corresponding circuit pads of the CPU and the associated imposed forces thereof in a balanced manner. As shown in FIGS. 1 and 1(A), the contacts area arranged in two regions with corresponding contacting arms arranged opposite to each other for counterbalancing the imposed forces, as well as what is shown in FIGS. 2 and 2(A). Anyhow, some chip circuit design directly mounted upon the printed circuit board, may prefer the corresponding solder balls in matrix with different pitches.

It is desirable to provide a CPU socket with the contacts arranged in matrix with different pitches while simultaneous considering the required wiping action and the associated imposed forces.

SUMMARY OF THE INVENTION

An object of the invention is to provide a CPU socket having an insulative housing equipped with two groups of contacts of different pitches from each other wherein either each group of contacts are arranged with the corresponding contacting arms in opposite directions to counterbalance the imposed/reaction forces itself or the two group of contacts are arranged with the corresponding contacting arms in opposite direction to somewhat counterbalance the imposed/reaction force during receiving a CPU therein, and or in a mixed manner, i.e., one group of contact with the corresponding contacting arms in the same direction while the other of contacts with the corresponding contacting arms in both opposite directions to achieve the total reaction forces in a substantial balanced manner.

DETAILED DESCRIPTION OF THE PREFERRED EMBODIMENT

Figure 3:
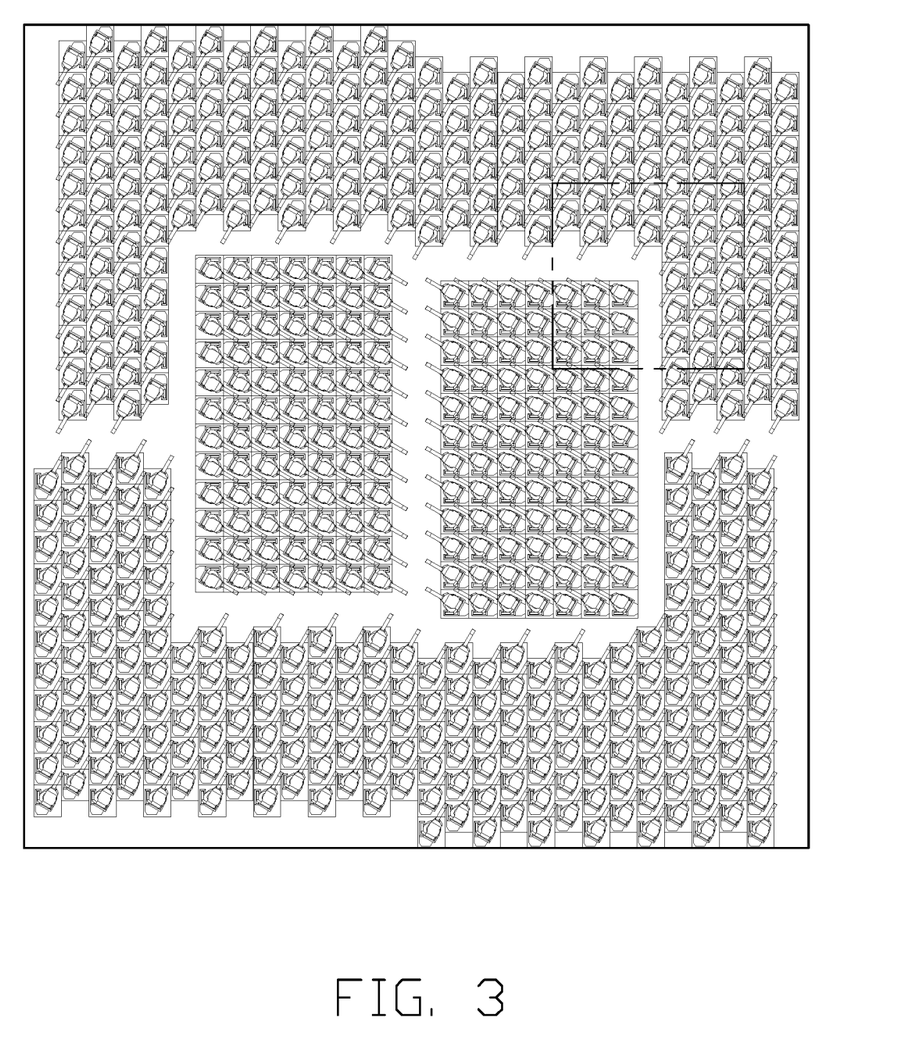
FIG. 3 is a top view of the CPU socket according to a first embodiment of the invention.
Figure 3A:
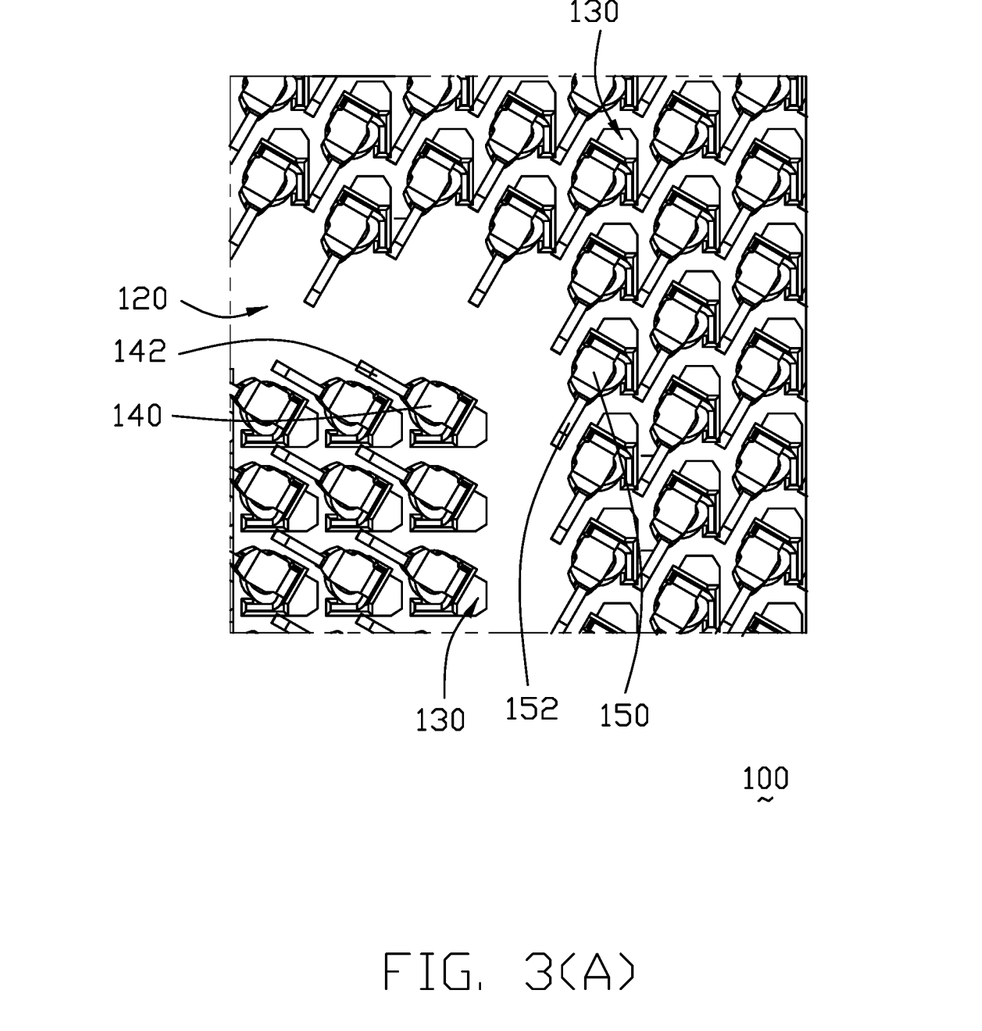
FIG. 3(A) is an enlarged top view of a portion of the CPU socket of FIG. 3.

Referring to FIGS. 3 and 3(A), the CPU socket 100 includes an insulative housing 120 defining a plurality of passageways 130 to receive the corresponding contacts. The contacts includes a first group of contacts 140 of the regular/rectangular 0.8 pitch arrangement, i.e., a first format in a top view, are located in a center region, and a second group of contacts 150 of the hex/hexangular 0.9 pitch arrangement, i.e., a second format in the top view, are located on the peripheral region surrounding the center region. Notably, in the first group the neighboring contacts are aligned with each other in both the row direction and the column direction while in the second group the neighboring contacts are offset from each other with a half pitch. The first group of contacts 140 are divided into two parts with the corresponding deflectable contacting arms 142, for mating with the CPU, extending opposite to each other so as to counterbalance the reaction forces thereof during mating with the CPU. Similarly, the second group of contacts 150 are divided into two parts with the corresponding deflectable contacting arms 152 extending opposite to each other for the same purpose. Notably, in this embodiment, the extending direction of the contacting arm 142 is perpendicular to that of the contacting arm 152.

Figure 4:
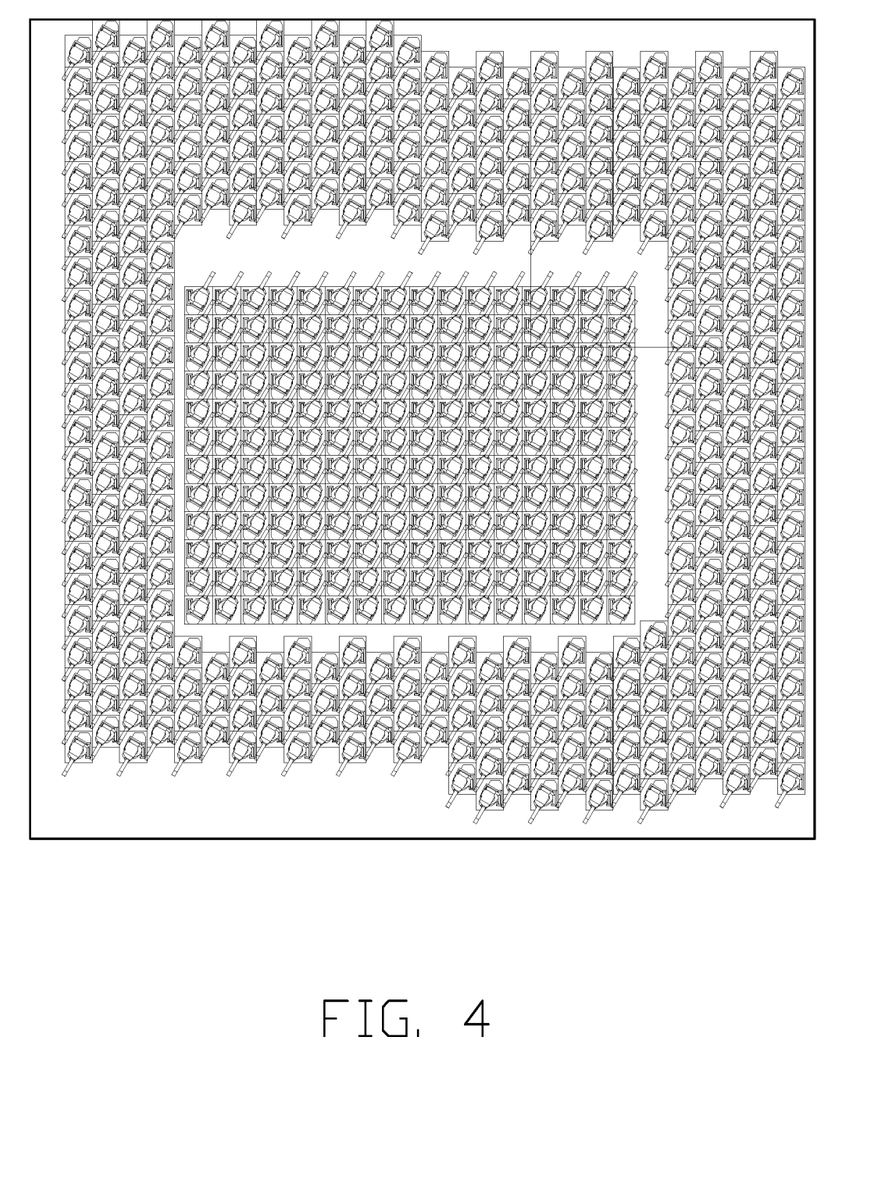
FIG. 4 is a top view of the CPU socket according to a second embodiment of the invention.
Figure 4A:
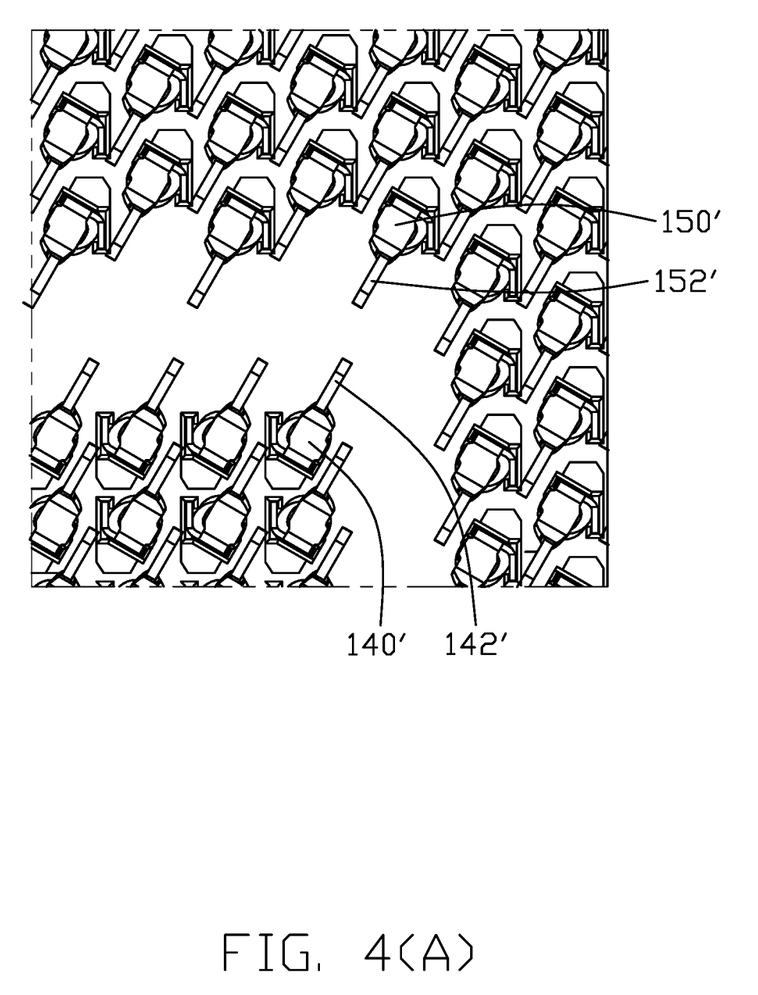
FIG. 4(A) is an enlarged top view of a portion of the CPU socket of FIG. 4.
Figure 5:
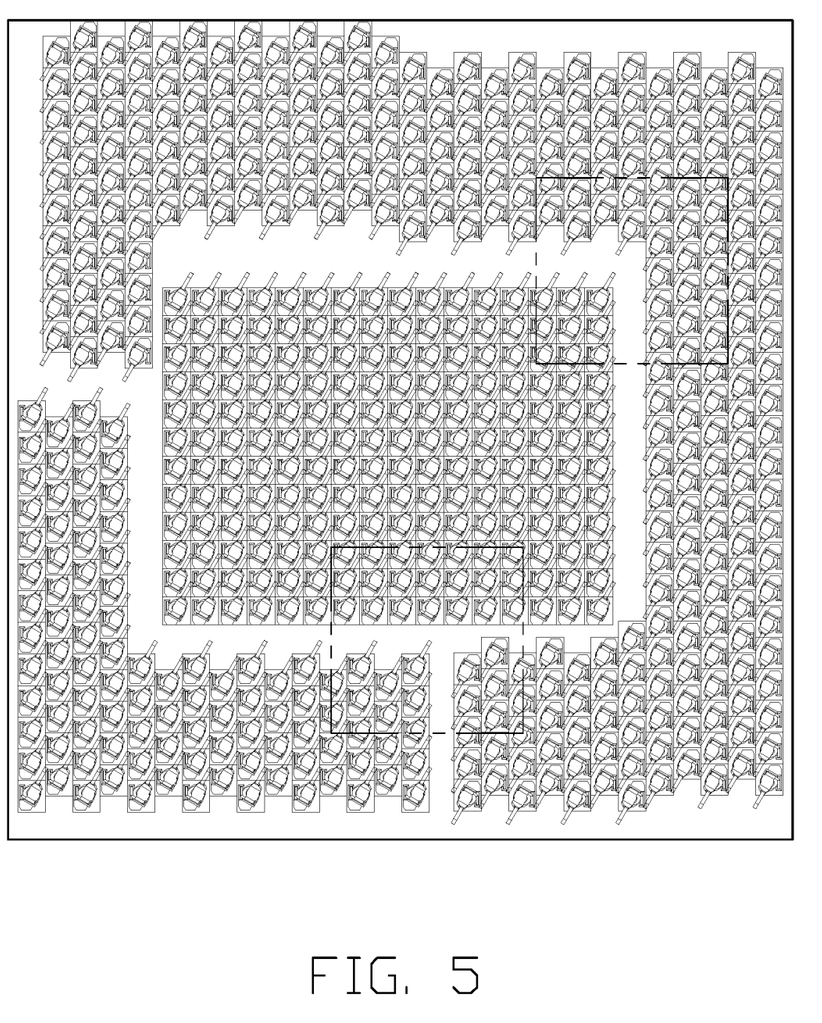
FIG. 5 is a top view of the CPU socket according to a third embodiment of the invention.
Figure 5A:
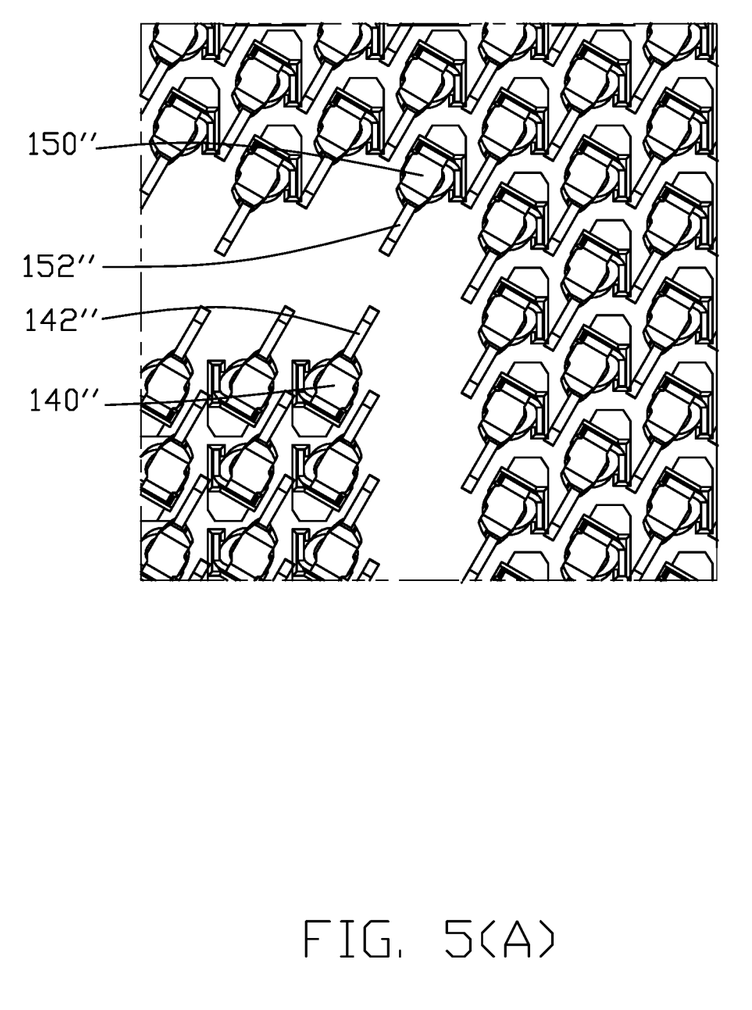
FIG. 5(A) is an enlarged top view of a portion of the CPU socket of FIG. 5.
Figure 5B:
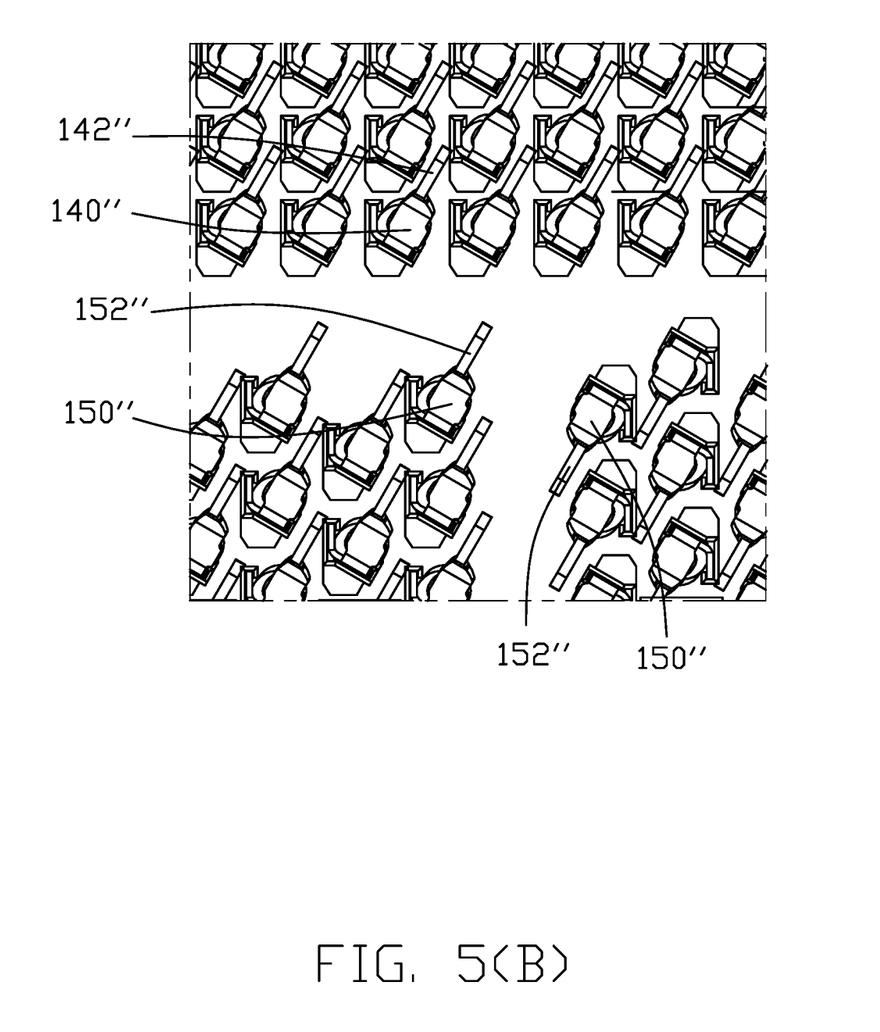
FIG. 5(B) is another enlarged top view of another portion of the CPU socket of FIG. 5.

Referring to FIGS. 4 and 4(A), the arrangement of the mixed pitch contacts is similar to the first embodiment except that the contacting arms 142' of the contacts 140' extend in the same first direction, and the contacting arms 152' of the contacts 150 extend in the same second direction opposite to the first direction. Understandably, this arrangement may not fully counterbalance the reaction forces while it is relatively easy for assembling/manufacturing Referring to FIGS. 5 and 5(A), the arrangement of the mixed pitch contacts is similar to the second embodiment except that the second group of contacts 150" are arrange with four sections wherein three sections is equipped with the contacts 150" having the corresponding contacting arms 152" extending in the same first direction while the remaining one section, i.e., the third quadrant, is equipped with the contacts 150" having the corresponding contacting arms 152" extending in the same second direction opposite to the first direction. Correspondingly, the first group of contacts 140" have the corresponding contacting arms 142" extending in the same second direction. Therefore, the total reaction forces may be counterbalanced compared with the second embodiment.

Understandably, all three embodiment are just exemplified. The invention essentially is related to the CPU socket equipped with the contacts of different pitches in different regions wherein the corresponding contacting arms extend in different/opposite directions for counterbalancing the total reaction forces. In addition, because the different pitch contact arrangement, the interference issue among different sections of different pitches is also another concern for the molding core pin design. Notably, the first embodiment shows the four segments design, the second embodiment shows the two segments design, and the third embodiment shows the three segments design. Anyhow, other number segment design may be optional according to the manufacturing desire.

Understandably, the feature of the invention is to arrange the different pitch contact groups in matrix, and this mixer pitch arrangement for the CPU socket contacts can be substantially applied to all the existing CPU sockets having the contacts in matrix, and particularly to the type of a great amount contacts, e.g., U.S. Pat. Nos. 6,957,973, 6,957,987, 7,429,200, 7,927,121, 8,454,373, 8,979,565, 8,998,623, 9,466,900, Publication Nos. 2019/0089098, 2019/0221956, CN107086401A, CN205863524U, CN205944491U, CN206685589U, and CN207282768U. In other words, the current infrastructure or the peripheral structure to which the key feature of the instant invention, i.e., the mixer pitch arrangement of the contacts, is applied, can be deemed as obvious/inherent parts with regard to the instant invention. That is to say, there is no patentability for the combination which uses the key feature of the instant invention upon the existing socket mechanisms because the key feature of the instant invention can be understandably applied thereto easily, even if the instant invention does not specifically mention such peripheral structures, i.e., the load plate to press the CPU, the stiffener to surround the socket, the cover for dustproof, the carrier for loading the CPU, the heat sink for mounting upon the CPU, or the printed circuit board on which the socket is mounted. In fact, as illustrated above, the instant invention also substantially discloses the related peripheral structures to which the key feature of the invention can be applied, thus being part of the instant invention. As to the contact structure, even if the drawings only show the top view, the solder ball is also partially shown. In fact, the basic structure of the contact can be referred to U.S. Pat. Nos. 7,563,107, 7,909,617 and 8,454,373, including the main body having two angled parts with retention thereof, from which the spring arm and the solder pad extend. Understandably, the solder ball is attached under the solder pad as the traditional design for mounting to the printed circuit board. In brief, the invention can be applied to the existing CPU sockets, disregarding how complex the structures or infrastructures thereof are, via simply replacing the existing contact arrangement with the inventive contact arrangement.

What is claimed is:

1. A CPU (Central Processing Unit) socket for coupling with a CPU, comprising:
   an insulative housing;
   a plurality of passageways formed in the housing and arranged in matrix;
   a plurality of contacts disposed in the corresponding passageways, respectively; and
   said contacts being categorized with a first group contacts having a first pitch, and a second group contacts having a second pitch different from the first pitch; wherein
   the first group contacts are located in a center region of the housing while the second group contacts are located in a peripheral region of the housing surrounding the center region.

2. The CPU socket as claimed in claim 1, wherein the first group contacts are arranged with two parts, having corresponding deflectable contacting arms extending in opposite directions, respectively.

3. The CPU socket as claimed in claim 1, wherein the second group contacts are arranged with two parts, having corresponding deflectable contacting arms extending in opposite direction, respectively.

4. The CPU socket as claimed in claim 1, wherein the first group contacts have corresponding deflectable contacting arms all extending in a first direction.

5. The CPU socket as claimed in claim 4, wherein the second group contacts have corresponding deflectable contacting arms all extending in a second direction opposite to the first direction.

6. The CPU socket as claimed in claim 4, wherein the second group contacts have most corresponding contacting arms extending in a second direction opposite to the first direction while less corresponding contacting arms extending in the first direction.

7. The CPU socket as claimed in claim 1, wherein the first group contacts are aligned with one another both a row direction and a column direction perpendicular to each other.

8. The CPU socket as claimed in claim 1, wherein neighboring contacts of the second group contacts are offset from each other in both a row direction and a column direction.

9. A CPU (Central Processing Unit) socket for coupling with a CPU, comprising:
   an insulative housing;
   a plurality of passageways formed in the housing and arranged in matrix;
   a plurality of contacts disposed in the corresponding passageways, respectively; and
   in a top view, said contacts being categorized with a first group contacts arranged with the first format, and a second group contacts arranged with the second format different from the first format; wherein
   the first group contacts, as well as the second group contacts, are divided into two subgroups with corresponding deflectable contacting arms extending opposite to each other.

10. The CPU socket as claimed in claim 9, wherein the first format is of a rectangular arrangement, and the second format is of a hexangular arrangement.

11. The CPU socket as claimed in claim 9, wherein the neighboring contacts in the first group contacts are aligned with each other in both a row direction and the column direction perpendicular to each other while the neighboring contacts in the second group contacts are offset from each other with a half pitch in both the row direction and the column direction.

12. The CPU socket as claimed in claim 9, wherein the second group contacts surround the first group contacts.

13. The CPU socket as claimed in claim 9, wherein the contacting arms of the first group contacts extend angled with respect to those of the second group contacts.

14. A CPU (Central Processing Unit) socket for coupling with a CPU, comprising:
   an insulative housing;
   a plurality of passageways formed in the housing and arranged in a matrix;
   a plurality of contacts disposed in corresponding passageways, respectively; and
   said contacts being categorized with a first group contacts having a first pitch and a second group contacts having a second pitch different from the first pitch; wherein the first group contacts are located in a center region of the housing while the second group contacts are located in a peripheral region of the housing surround the center region;

the first group contacts are arranged with two parts having corresponding deflectable contacting arms extending in opposite directions, respectively, for counterbalancing reaction forces; and the second group contacts are arranged with two parts having corresponding deflectable contacting arms extending in opposite direction, respectively, for counterbalancing reaction forces.

15. The CPU socket as claimed in claim 14, wherein the contacting arms of the second group contacts extend along a direction roughly perpendicular to a direction along which the contacting arms of the first group contacts extend.

\* \* \* \* \*